April 4, 1967 F. F. OFFNER 3,312,910
FREQUENCY MODULATION OF RADIATION EMITTING P-N JUNCTIONS
Filed May 6, 1963
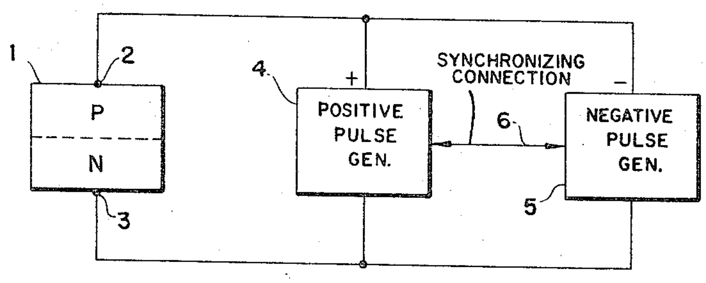
INVENTOR.
BY
ATTORNEY United States Patent Office 3,312,910

Patented Apr. 4, 1967

3,312,910

FREQUENCY MODULATION OF RADIATION EMITTING P-N JUNCTIONS

Franklin F. Offner, 1890 Telegraph Road, Deerfield, Ill. 60015

Filed May 6, 1963, Ser. No. 278,094
3 Claims. (Cl. 331—94.5)

This invention relates to radiation emitters of the semiconductor type and more particularly to means for varying the wavelength of the radiation emitted thereby.

It has been found that certain semiconductors can be excited to emit radiation. One example of such a semiconductor is the gallium arsenide diode. The gallium arsenide diode has been excited to emit coherent light (i.e. laser) in the infrared region. Other semiconductors may be excited to emit radiation. As an additional example, it is believed that indium antimonide possesses the capability of being excited and providing laser action.

It is an object of the present invention to provide an arrangement whereby the wavelength of radiation emitted by a semiconductor may be varied.

The invention will be illustrated by using the gallium arsenide laser as an example, but it should be understood that the concepts of the present invention are applicable to other radiation emitting substances of the semiconductor P-N junction type and is not specifically limited to laser-type radiation emission.

Other features and objects of the invention will be better understood from a consideration of the following detailed description when read in conjunction with the attached drawing, the single figure of which illustrates a P-N junction type semiconductor and associated control circuitry for varying the wavelengths of the radiation emitted thereby.

Referring now to the drawing, reference numeral 1 denotes a semiconductor crystal, such a gallium arsenide, having one region of the P type and another region of the N type. Electrodes 2 and 3 affixed to the two surfaces of the crystal 1 permit the introduction of current pulses from a pulse generator 4. The current pulses introduced by the pulse generator 4 are such as to provide current densities in the junction area of the crystal 1 in excess of 10,000 amperes per square centimeter. By keeping the area of the junction relatively small, the current required from the pulse generator 4 may be maintained within conveniently available limits.

A second pulse generator 5 is connected in parallel with the pulse generator 4 and produces high voltage pulses in a direction opposite to those produced by the generator 4. For convenience, the two pulse generators 4 and 5 will be termed "positive" and "negative," respectively. The two pulse generators 4 and 5 are synchronized by means of a synchronizing connection 6 in a conventional manner.

In operation, the pulse generator 4 provides a high current pulse of very brief duration. The duration of the current pulse may be as short as a small fraction of a microsecond. It is necessary that the duration of the current pulse produced by the generator 4 be short as compared with the average lifetime of the excited levels produced by the current pulse in the P-N junction of the crystal 1. However, with this limitation, the current pulse must be as long as possible in order to permit the transferring of sufficient energy to the crystal 1. A suitable value for the duration of the current pulse is 5% of the average lifetime of the levels excited in the crystal 1. However, this particular value is subject to numerous variations and is exemplary only.

Immediately following the current pulse provided by the generator 4, a reverse voltage pulse is provided by the pulse generator 5. The function of the voltage pulse is to provide variation in the energy gap between the donor and acceptor levels of the crystal 1, these levels being responsible for the emission of radiation. Thus, the increase in the energy gap which results from the establishment of a voltage gradient across the junction in the crystal 1 as a result of applying the voltage pulse from the generator 5 decreases the wavelength of the emitted radiation. The duration of the voltage pulse from the generator 5 need be only as long as is required for radiation to be emitted by the crystal 1. This period of time may be from a few microseconds to a few milliseconds.

Suitable faces of the crystal 1 may be silvered to produce internal reflections, in the well-known manner of the production of lasers. Alternatively, the crystal 1 may be incorporated as the lasering element in the frequency selective laser configuration of applicant's copending application Ser. No. 247,045, filed Dec. 26, 1962, entitled "Lasers," and assigned to the assignee of the present invention.

It should be noted that the pulse generators 4 and 5 must be constructed to prevent the power generated by one from being dissipated in the other. To this end, commutating and blocking devices of a well-known nature may be incorporated in the output circuits of the two generators as will be apparent to those skilled in the art.

It is not essential to the nature of the invention what method is used for obtaining the sequential application of pulses to the crystal 1. The use of two independent pulse generators is purely illustrative, and any other convenient method may be employed such as inducted discharges, oscillating circuits, etc.

It now should be apparent that the present invention provides an arrangement whereby the wavelengths of radiation emitted by a semiconductor may be varied. Although a particular arrangement and a particular semiconductor has been discussed in connection with the specific embodiment constructed in accordance with the teachings of the present invention, others may be utilized. Furthermore, it will be understood that although an exemplary embodiment of the present invention has been disclosed and discussed, other applications and arrangements are possible and that the embodiment disclosed may be subjected to various changes, modifications and substitutions without necessarily departing from the spirit of the invention.

What is claimed is:

1. A radiation emitting crystal of the semiconductor type, including a P-N junction, said junction being characterized by having excited energy levels of finite lifetime which are excited by a forward exciting current, means for passing a forward exciting current pulse which is short in comparison with the average lifetime of the excited energy levels and which has an amplitude sufficient to produce a high current density at said junction through said junction, and means for applying reverse bias voltage to said junction immediately following application of said current pulse and within said lifetime following said current pulse, thereby shifting the wavelengths of the radiation emitted by said semiconductor.

2. Apparatus as defined in claim 1 wherein said radiation emitting semiconductor is included in a multi-reflecting path to provide laser action.

3. Apparatus for varying the wavelength of radiation emitted by a semiconductor including a P-N junction said junction being characterized by having excited energy levels of finite lifetime which are excited by a forward exciting current, first means connected with said semiconductor for passing a forward exciting current pulse which is short in comparison with the average lifetime of the excited energy levels and which has an amplitude sufficient to produce a high current density at said junction through said junction, and second means connected with said semiconductor for applying reverse bias to said junction immediately following application of said current pulse and within said lifetime following said current pulse, to thereby shift the wavelength of the radiation emitted by said semiconductor.

References Cited by the Examiner

UNITED STATES PATENTS

| | | | |
|---|---|---|---|
| 2,817,783 | 12/1957 | Loebner | 317—235 |
| 3,121,203 | 2/1964 | Heywang | 313—108 |
| 3,245,002 | 4/1966 | Hall | 317—234 X |

JOHN W. HUCKERT, *Primary Examiner.*

D. O. KRAFT, *Assistant Examiner.*